United States Patent
Kim et al.

(10) Patent No.: US 9,672,894 B2
(45) Date of Patent: Jun. 6, 2017

(54) DEVICE AND METHOD OF CONTROLLING REFRESH OPERATION FOR DYNAMIC RANDOM ACCESS MEMORY (DRAM)

(71) Applicant: Samsung Electronics Co., Ltd., Suwon-si (KR)

(72) Inventors: Young-Hun Kim, Seoul (KR); In-Chul Jeong, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 85 days.

(21) Appl. No.: 14/197,437

(22) Filed: Mar. 5, 2014

(65) Prior Publication Data
US 2014/0269134 A1    Sep. 18, 2014

(30) Foreign Application Priority Data
Mar. 13, 2013  (KR) .................. 10-2013-0026489

(51) Int. Cl.
*G11C 11/406* (2006.01)
*G11C 11/408* (2006.01)
(Continued)

(52) U.S. Cl.
CPC .......... *G11C 11/408* (2013.01); *G11C 7/1063* (2013.01); *G11C 11/40611* (2013.01)

(58) Field of Classification Search
CPC .................................................. G11C 11/406
(Continued)

(56) References Cited

U.S. PATENT DOCUMENTS

| 5,329,490 A | 7/1994 | Murotani |
| 5,644,545 A | 7/1997 | Fisch |

(Continued)

FOREIGN PATENT DOCUMENTS

| JP | 11-039861 | 2/1999 |
| KR | 10-1999-0013963 A | 2/1999 |
| KR | 10-2003-0073160 A | 9/2003 |

OTHER PUBLICATIONS http://en.wikipedia.org/wiki/Memory_refresh, Nov. 19, 2014.*

*Primary Examiner* — Anthan Tran
*Assistant Examiner* — Mushfique Siddique
(74) *Attorney, Agent, or Firm* — Muir Patent Law, PLLC

(57) ABSTRACT

A method of controlling a refresh operation for a memory device is disclosed. The method includes storing a first row address corresponding to a first row of a memory cell array, storing one or more second row addresses corresponding to one or more second rows of the memory cell array, the one or more second row addresses corresponding to the first row address, sequentially generating row addresses as a refresh row address during a first refresh interval, for each generated row address, when a generated row address identical to one of the one or more second row addresses is detected, stopping the generation of row addresses and sequentially outputting the one second row address and the first row address as the refresh row address, restarting the generation of the row addresses as the refresh row address after outputting the one second row address and the first row address.

17 Claims, 9 Drawing Sheets

(51) Int. Cl.
*G11C 11/401* (2006.01)
*G11C 7/10* (2006.01)

(58) Field of Classification Search
USPC .......................................................... 365/222
See application file for complete search history.

(56) References Cited

U.S. PATENT DOCUMENTS

| | | | |
|---|---|---|---|
| 5,933,377 A | 8/1999 | Hidaka | |
| 5,991,218 A | 11/1999 | Kushiyama | |
| 6,166,980 A | 12/2000 | Chun | |
| 7,565,479 B2* | 7/2009 | Best | G11C 11/406 |
| | | | 711/103 |
| 7,734,866 B2* | 6/2010 | Tsern | G11C 11/406 |
| | | | 365/185.25 |
| 7,836,374 B2 | 11/2010 | Klein | |
| 2003/0169635 A1 | 9/2003 | Kim | |
| 2004/0196719 A1* | 10/2004 | Aritomi | G11C 11/406 |
| | | | 365/222 |
| 2005/0249010 A1* | 11/2005 | Klein | G11C 7/20 |
| | | | 365/222 |
| 2007/0242546 A1* | 10/2007 | Koshikawa | G11C 11/406 |
| | | | 365/222 |
| 2012/0300568 A1* | 11/2012 | Park | G11C 11/40618 |
| | | | 365/222 |
| 2013/0282973 A1* | 10/2013 | Kim | G11C 11/40622 |
| | | | 711/106 |
| 2014/0169114 A1* | 6/2014 | Oh | G11C 11/40611 |
| | | | 365/222 |
| 2015/0043295 A1* | 2/2015 | Kim | G11C 11/406 |
| | | | 365/222 |

* cited by examiner

FIG. 1

| ROW ADDRESS | STORED ADDRESS | | ROW ADDRESS | STORED ADDRESS | | ROW ADDRESS | STORED ADDRESS | |
|---|---|---|---|---|---|---|---|---|
| 0000 | | | 0000 | | | 0000 | | |
| 0001 | | | 0001 | | | 0001 | | |
| 0010 | BABY | DEFECT | 0010 | BABY | DEFECT | 0010 | | |
| 0011 | | | 0011 | | | 0011 | | |
| 0100 | | | 0100 | | | 0100 | | |
| 0101 | | | 0101 | | | 0101 | | |
| 0110 | MOM1 | | 0110 | MOM1 | | 0110 | | |
| 0111 | | | 0111 | | | 0111 | | |
| 1000 | | | 1000 | | | 1000 | | |
| 1001 | | | 1001 | | | 1001 | | |
| 1010 | MOM2 | | 1010 | MOM2 | | 1010 | | |
| 1011 | | | 1011 | | | 1011 | | |
| 1100 | | | 1100 | | | 1100 | | |
| 1101 | | | 1101 | | | 1101 | | |
| 1110 | MOM3 | | 1110 | MOM3 | | 1110 | | |
| 1111 | | | 1111 | | | 1111 | | |

16 ROWS/256ms     16 ROWS/128ms     16 ROWS/64ms

DEVICE AND METHOD OF CONTROLLING REFRESH OPERATION FOR DYNAMIC RANDOM ACCESS MEMORY (DRAM)

CROSS-REFERENCE TO RELATED APPLICATION

This application claims priority under 35 USC §119 to Korean Patent Application No. 10-2013-0026489, filed on Mar. 13, 2013, in the Korean Intellectual Property Office (KIPO), the contents of which are herein incorporated by reference in their entirety.

BACKGROUND

1. Technical Field

Example embodiments relate generally to a memory device, and more specifically to a method of controlling a refresh operation in a memory device such as a DRAM device, capable of relieving a weak cell having poor retention characteristic.

2. Discussion of the Related Art

In a dynamic random access memory (DRAM), the electric charges charged in a cell capacitor gradually leak out of the cell capacitor. Thus, there is a need to rewrite and refresh data in a memory cell within a predetermined period. Such a refresh operation may cause power consumption so that a battery usable time of a portable electronic apparatus using a DRAM may be reduced. Thus, reduction of an average current in the refresh operation is an important factor of determining the battery usable time. Therefore, it is preferable to extend a refresh interval in order to reduce the refresh current. However, as the refresh interval extends, the cell having poor retention characteristic leaks electric charges out of the cell capacitor, causing damage to data.

In the related art, a repair technique of substituting a redundancy row for the cell having a poor retention characteristic has been used in order to improve the yield rate. However, since the redundancy row occupies the chip area, this scheme obstructs miniaturization of a chip size.

In another scheme, the cell having a poor retention characteristic may be relieved by additionally and concurrently refreshing the cell having the poor retention characteristic at a timing of an address having the most significant bit different from that of an address of the cell having the poor retention characteristic without using a redundancy. However, since the concurrent refresh scheme may need double the refresh current, additional circuit designs for a noise problem and a power supply capacity are may be needed.

In still another scheme, the cell having a poor retention characteristic may be relieved by restarting an addressing of a normal row after additionally performing the row-refresh of the cell having the poor retention characteristic at a timing of an address having the most significant bit different from that of an address of the cell having the poor retention characteristic. Some prior art suggests a scheme of storing a weak cell address and comparing an offset address obtained by inverting the most significant bit of a refresh shadow counter through an inverter with the weak cell address. According to the above technology, although the weak cells, which have a retention time equal to or longer than a half of a reference refresh interval and shorter than the reference refresh interval, may be easily relieved by inverting the most significant bit, an offset address generating circuit for the weak cells having a retention time less than the half reference refresh interval may not be easily implemented and a repair work according to a test result is very difficult.

SUMMARY

Some example embodiments provide a method of controlling a refresh operation for a memory device capable of reliving weak cells having a retention time shorter than a reference refresh interval.

Further, some example embodiments provide a memory device such as a dynamic random memory (DRAM) device in which weak cells having a retention time shorter than a reference refresh interval can be relieved or repaired while minimizing modification of a DRAM circuit.

According to example embodiments, a method of controlling a refresh operation for a memory device, includes, storing a first row address corresponding to a first row of a memory cell array; storing one or more second row addresses corresponding to one or more second rows of the memory cell array, the one or more second row addresses corresponding to the first row address; sequentially generating row addresses as a refresh row address during a first refresh interval; for each generated row address, when a generated row address identical to one of the one or more second row addresses is detected, stopping the generation of row addresses and sequentially outputting the one second row address and the first row address as the refresh row address; and restarting the generation of row addresses as the refresh row address after outputting the one second row address and the first row address.

The first row address may designate a first row including a weak cell having a data retention time shorter than a second refresh interval shorter than the first refresh interval, and the one or more second row addresses may designate second rows including memory cells such that all memory cells in the second rows have data retention times at least as long as the second refresh interval.

The first refresh interval may be determined as $T\_adjusted = T\_target + N \times t\_REF$, where $T\_target$ is a refresh interval for all rows of the memory cell array if none included weak cells, $N$ is a number of the one or more second row addresses and $t\_REF$ is a target refresh time period for each row of the memory cell array. A shortened refresh interval of a first row designated by the first row address may be determined as $T\_Baby = T\_adjusted/(N+1)$.

The first row address and the one or more second row addresses may be stored through fuse programming.

Outputting the one second row address and the first row address may include outputting the first row address; and outputting the one second row address after outputting the first row address.

Outputting the one second row address and the first row address may include outputting the one second row address; and outputting the first row address after outputting the one second row address.

At least one least significant bit of each second row address is identical to at least one least significant bit of the first row address.

Memory cells connected to the first row are refreshed more frequently by $(N+1)$ times than other memory cells connected to other rows of the memory cell array, wherein $N$ is a number of the one or more second addresses, and wherein at least one memory cell connected to the first row includes one weak cell having a data retention time shorter than a second refresh interval shorter than the first refresh interval.

According to example embodiments, a memory device includes a memory cell array including a plurality of memory cells; a refresh row address generation circuit configured to sequentially generate row addresses of the memory cell array as a refresh row address during a first refresh interval; and a refresh row address insertion circuit that is configured to: store a first row address and one or more second row addresses corresponding to the first row address of the memory cell array; detect whether the generated row address is identical to one second row address of the stored second row addresses; and for each generated row address, when a generated row address identical to the one second row address is detected, stop the generation of row addresses and sequentially output the one second row address and the first row address as the refresh row address, wherein the refresh row address generation circuit is configured to restart the generation of row addresses as the refresh row address after outputting the one second row address and the first row address.

The refresh row address generation circuit may include a refresh timer configured to generate a refresh pulse signal having a target refresh period in response to a stop control signal from the refresh row address insertion circuit; and a refresh counter configured to generate the row addresses as the refresh row address by counting pulses in the refresh pulse signal.

The refresh row address insertion circuit may include one or more insertion row address generation circuits configured to, when the generated row address identical to the one second row address is detected, sequentially output the first row address and the one second row address as an insertion row address; a stop control signal generation circuit configured to generate the stop control signal in response to the detection of the generated row address identical to the one second row address; and a refresh row address output circuit configured to output the refresh row address including one of the insertion row address from the row address generation circuits and the generated row address from the refresh counter in response to the detection of the generated row address identical to the one second row address.

Each of the insertion row address generation circuits may include a storage circuit configured to store the first row address and the one second row address; a comparator configured to compare the one second row address with the generated row address; and a fuse enable circuit to control outputs of the storage circuit in response to a result of the comparator.

The storage circuit may include a laser blowing fuse.

At least one least significant bit of each second row address is identical to at least one least significant bit of the first row address.

The first refresh interval may be determined as T_adjusted=T_target+N×t_REF where T_target is a target refresh interval for all rows of the memory cell array if none included weak cells, N is a number of the one or more second row addresses and t_REF is a target refresh time period for each row of the memory cell array. A shortened refresh interval of a first row designated by the first row address may be determined as T_Baby=T_adjusted/(N+1).

According to example embodiments, a method of a refresh operation for a memory device including a memory cell array is provided. The method comprises performing the refresh operation on the memory cell array in response to refresh row addresses during a first refresh interval, storing a first row address corresponding to a first row of the memory cell array, the first row connected to one or more weak memory cells having a retention time shorter than a reference refresh interval shorter than the first refresh interval, storing one or more second row addresses corresponding to one or more respective second rows of the memory cell array, the one or more respective second rows connected to memory cells having a retention time equal to or longer than the reference refresh interval, sequentially generating row addresses as a refresh row address, and for each generated row address, when the generated row address is not the same as any of the one or more second row addresses, sequentially outputting the generated row address as the refresh row address, and when the generated row address is the same as one of the one or more second row addresses, stopping generation of row addresses and sequentially outputting the first row address and the one second row address as the refresh row address.

According to the refresh control method of an example embodiments, since the one or more second rows may be easily designated through the laser blowing fuse program, the refresh interval of the weak row address or the first row address can be arbitrarily adjusted to a desired refresh interval. Thus, the weak cells having a short retention time can be easily relived without exerting influence on a chip size, so the test and repair processes can be simplified.

BRIEF DESCRIPTION OF THE DRAWINGS

Illustrative, non-limiting example embodiments will be more clearly understood from the following detailed description taken in conjunction with the accompanying drawings.

FIG. 1 is example diagrams illustrating a baby row address and a mom row address according to a result of testing a row address with respect to each refresh interval according to one embodiment.

DETAILED DESCRIPTION OF THE EMBODIMENTS

Figure 2:
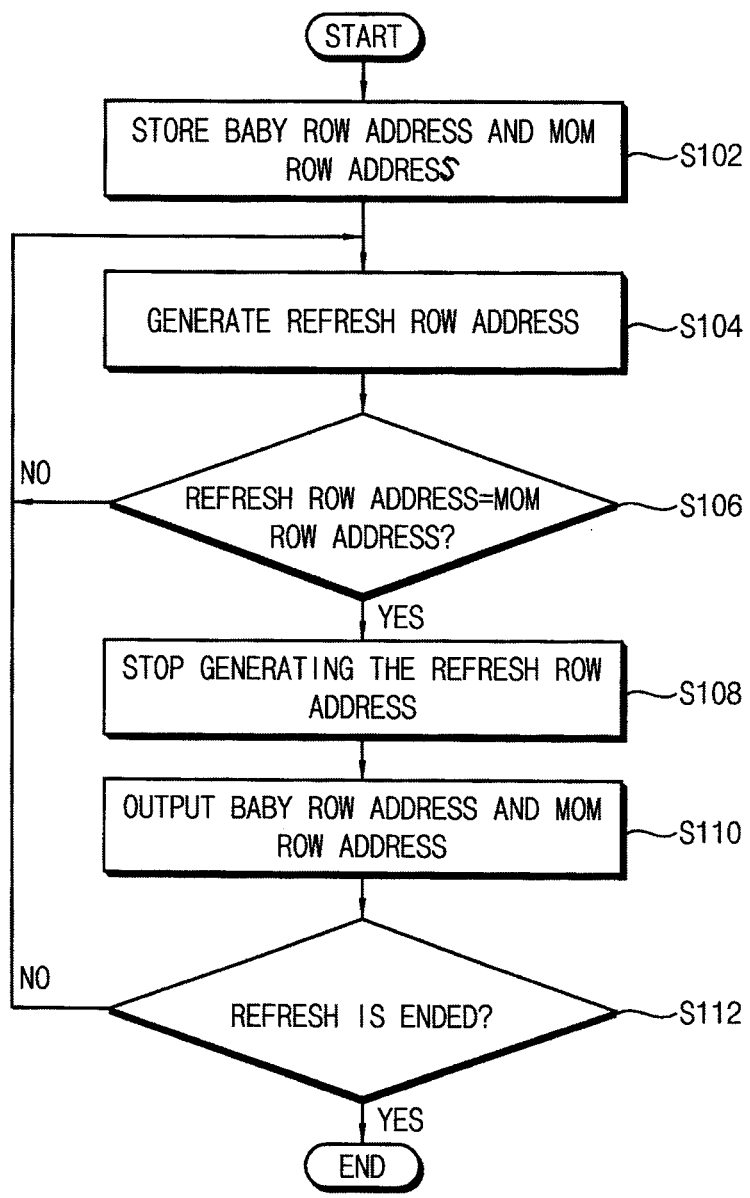
FIG. 2 is a flowchart illustrating a refresh control method for a DRAM according to an example embodiment.

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is assumed for the purpose of convenience of explanation in an example embodiment that a target refresh interval is 256 ms, and one row refresh is performed within a target refresh time period of 16 ms in a specific refresh mode. For example, it is assumed that each row of 16 rows is refreshed within 16 ms and every row is refreshed at least once during the interval of 256 ms. The target refresh interval refers to an amount of time for a typical refresh for all 16 rows (e.g., if none include weak cells).

FIG. 1 shows example diagrams illustrating a baby row address and a mom row address according to a result of testing a row address with respect to each refresh interval according to one embodiment.

As shown in FIG. 1, when testing a DRAM at the wafer level, all memory cells are tested with the retention time of 256 ms which is a reference refresh interval. At this time, it is assumed that the defect of 1 bit occurs in the row of binary number '0010'. As the test result, it is understood that the memory cell of 1 bit in the cell array does not satisfy the retention time of 256 ms and the remaining cells have the retention time of 256 ms or more.

All memory cells are sequentially read out after changing the retention time into 128 ms and it is checked whether write data are the same as the read data. In this case, likewise, it is assumed that the defect of 1 bit occurs in the row of binary number '0010'. As the test result, it is known that only the memory cell of 1 bit in the cell array does not satisfy the retention time of 128 ms and the remaining cells have the retention time of 128 ms or more.

All memory cells are read out in order after changing the retention time into 64 ms and it is checked whether write data are the same as the read data. If all data are the same, it is ensured that all memory cells have the retention of 64 ms or more. As the test result, it is known that only the memory cell of 1 bit in the cell array has the retention time in the range of 64 ms to 128 ms and the remaining cells have the retention time of 256 ms or more.

In this disclosure, the address of the row of binary number '0010' may be referred to as a first row address or a baby row address and each address of the rows of binary numbers '0110, 1010 and 1110', two least significant bits of which have the same values, may be referred to as a second row address or a mom row address. The baby row address is an address of a row having a defective cell which has a retention time shorter than the reference refresh interval and the mom row address is an address appointed among addresses of rows including cells having a typical retention time (e.g., not including any defective cell). Baby addresses may also be referred to herein as weak cell row addresses and mom addresses may be referred to herein as non-weak cell row addresses. One or more mom row addresses may correspond to or be mapped to the baby row address.

FIG. 2 is a flowchart illustrating a refresh control method according to an example embodiment.

Referring to FIG. 2, according to the refresh control method, the baby row address detected by the test described above and the mom row address for additionally refreshing the baby row address are determined and the baby and mom row addresses may be stored in a fuse circuit of the DRAM in step S102. The fuse circuit may store the baby and mom row addresses through, for example, a laser-zapping by using a laser blowing fuse circuit included in a row redundancy circuit of a DRAM. In step S104, a refresh row address is generated. For example, row addresses of the memory cell array are generated sequentially as the refresh row address during a first refresh interval through a refresh counter. During the refresh operation, it is detected in step S106 whether the refresh row address identical to a mom row address is generated. If the identical row address is generated in step S106, the generation of the refresh row address is stopped in step S108 and the mom row address and the baby row address are output in step S110 instead of the generated row address being output from the counter. The baby row address is additionally refreshed when the generated row address from the counter is identical to the mom row address. In step S112, an end is checked. If not ended, the process returns to step S104 in order to resume the generation of refresh row addresses.

For example, during the first refresh interval, the baby row address can be repeatedly refreshed more often than the first refresh interval by an interval (N+1) times in proportion to the number N of mom row addresses. Therefore, since a refresh interval of the baby row address may be controlled at the arbitrary frequency in proportion to the number of mom row addresses, the refresh interval of the weak cell may be easily controlled.

In one embodiment, the first refresh interval T_adjusted is determined as target refresh interval T_target+a number of mom row addresses N×target refresh time period t_REF. The target refresh interval may be described as, for example, a reference refresh interval for refreshing all rows of a memory cell array if none of memory cells are weak. The target refresh time period may refer to a time between 2 consecutive rows being refreshed within a refresh interval. For example, the baby row refresh interval T_Baby may be determined as the first refresh interval T_adjusted/(number of mom row address N+1).

Figure 3:
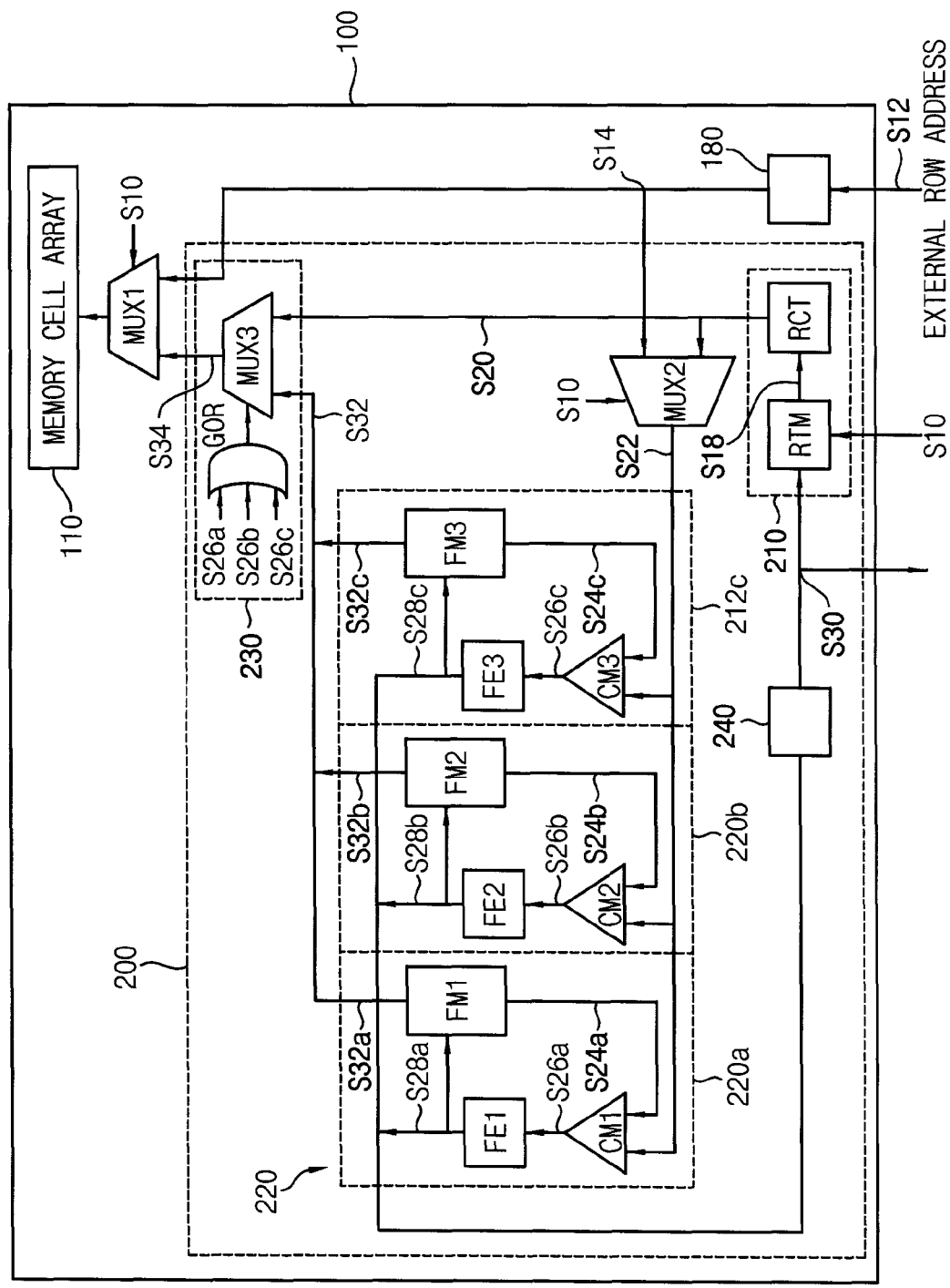
FIG. 3 is a block diagram illustrating a memory device including refresh circuit according to an example embodiment.
Figure 4:
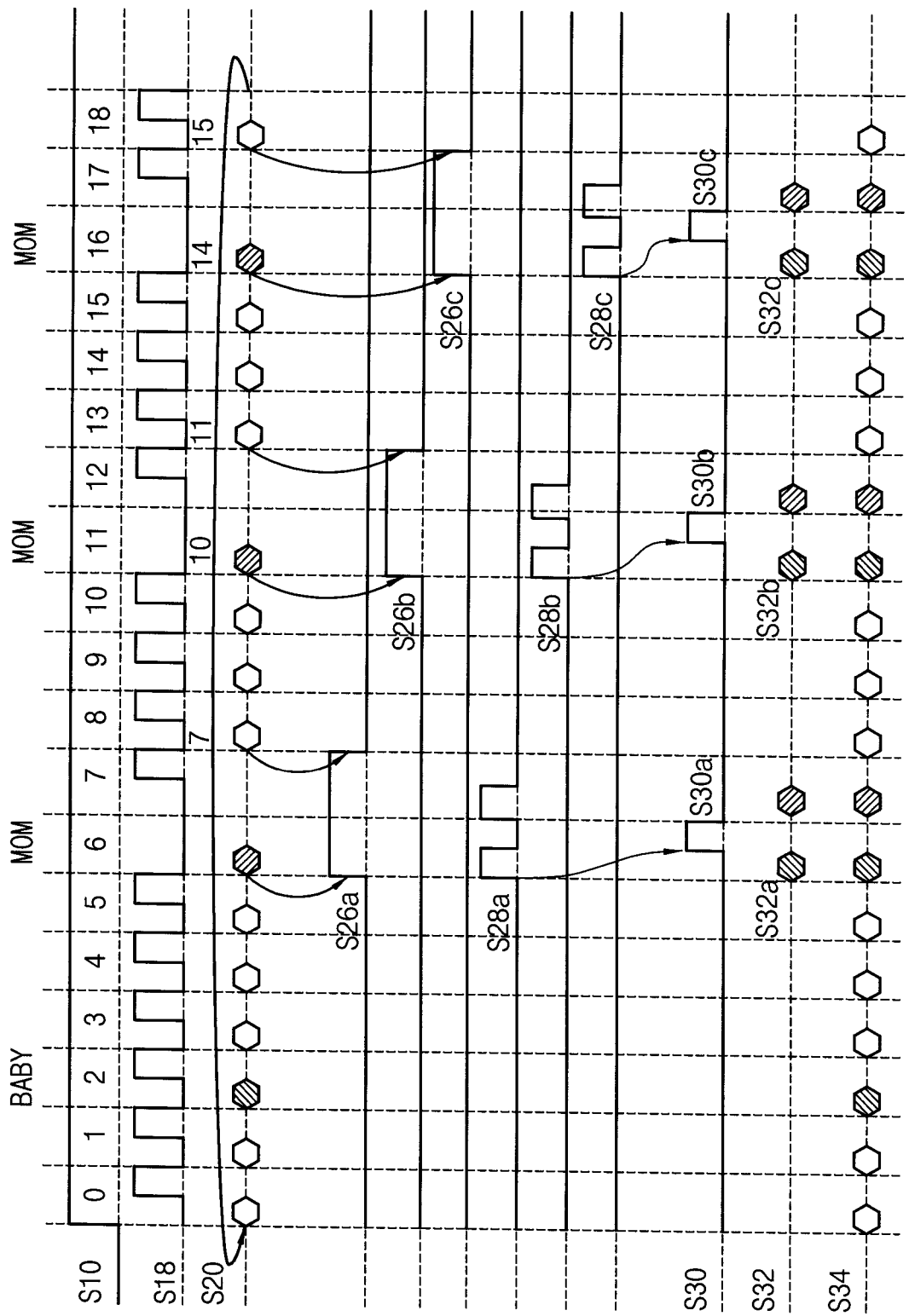
FIG. 4 is a timing diagram illustrating an operation of the refresh circuit in FIG. 3 according to an example embodiment.
Figure 5:
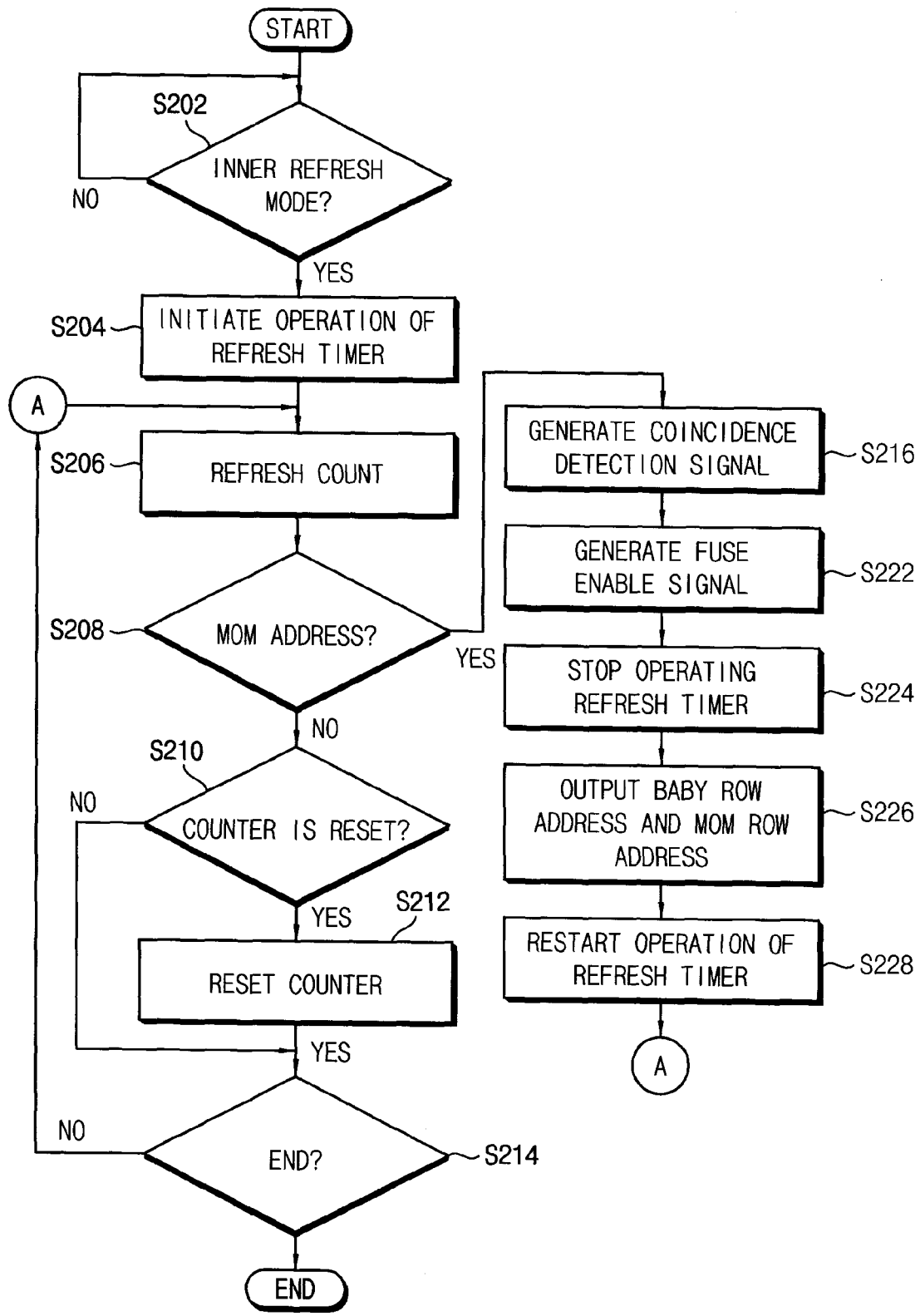
FIG. 5 is a flowchart illustrating an operation of the refresh circuit in FIG. 3 according to an example embodiment.
Figure 6:
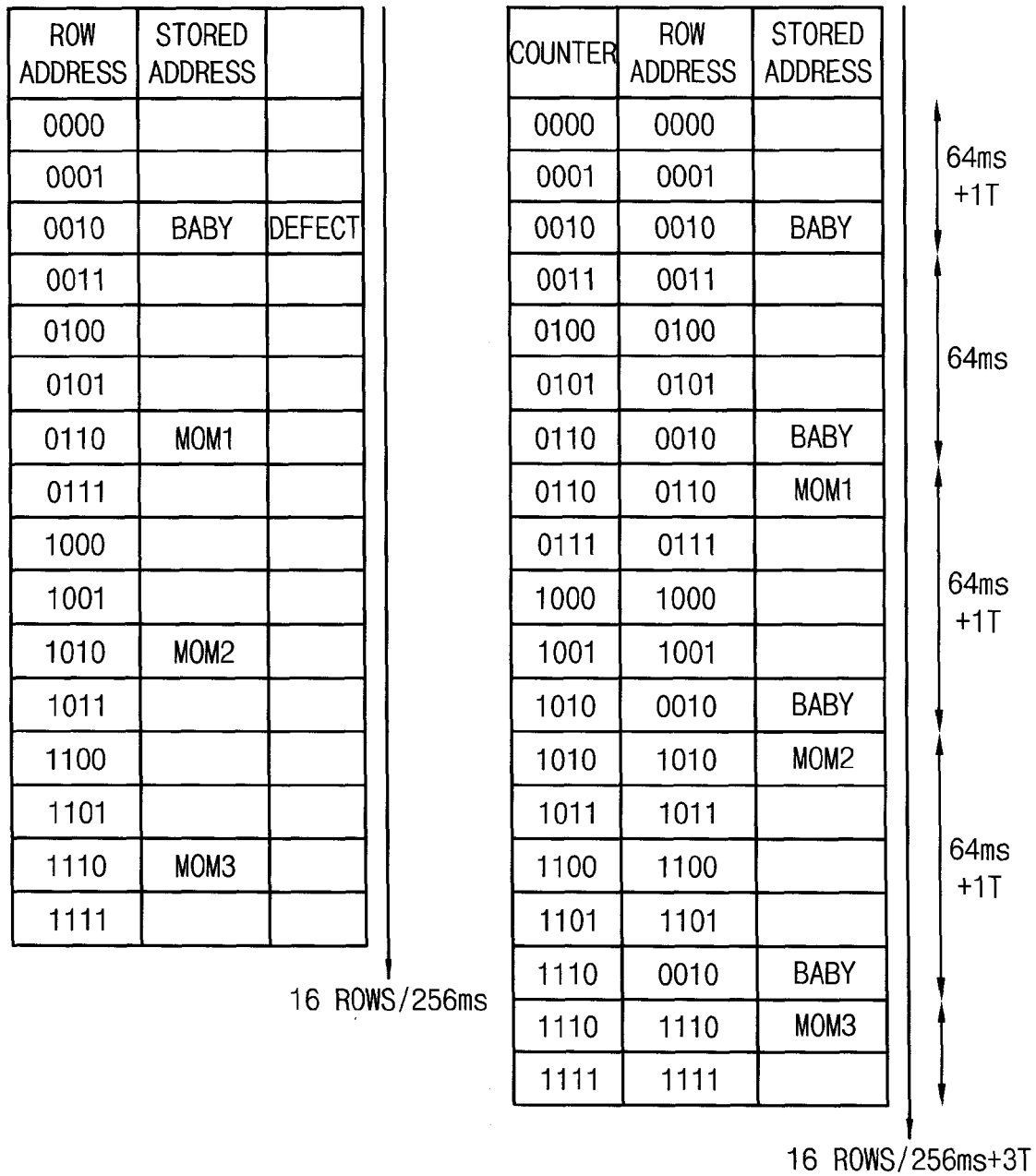
FIG. 6 is a diagram illustrating an example of designation of a mom row address and a refresh interval according to a retention time of a baby row address according to an example embodiment.

FIG. 3 is a block diagram illustrating a memory device including a refresh circuit according to an example embodiment, and FIG. 4 is a timing diagram illustrating an operation of the refresh circuit in FIG. 3 according to an example embodiment. FIG. 5 is a flowchart illustrating an operation of the refresh circuit in FIG. 3 according to an example embodiment, and FIG. 6 is a diagram illustrating an example of designation of a mom row address and a refresh interval according to a retention time of a baby row address according to an example embodiment.

Referring to FIG. 3, a DRAM 100 includes, for example, a memory cell array 110, an address input circuit 180, a refresh circuit 200 and a multiplexer MUX1.

The multiplexer MUX1 selectively provides the inner refresh row address generated from the refresh circuit 200 and an external refresh row address input through the address input circuit 180 to a row decoder of the memory cell array 110 in response to a refresh mode signal.

The address input circuit 180 inputs the external row address S12 such that the buffered inner row address S14 is provided to one side input terminal of the multiplexer MUX1.

The refresh circuit 200 includes a refresh row address generation circuit 210, an insertion row address generation circuit 220, a refresh row address output circuit 230, a stop control signal generation circuit 240 and a multiplexer MUX2. The refresh row address generation circuit 210 includes a conventional refresh timer RTM and a refresh counter RCT.

The refresh timer RTM is enabled when the refresh mode signal S10 depicted in FIG. 4 has a high level so that a refresh pulse signal S18 having a refresh period is generated. The refresh counter RCT counts the refresh pulse signal to generate the counter output S20 depicted in FIG. 4. As shown in FIG. 4, the refresh counter RCT generates a counter output which is increased by '1' during the first refresh interval and is reset when arriving at the end of the first refresh interval so that the output is reset into zero.

The multiplexer MUX2 selects the inner row address S14 provided from an outside and the counter output S20 generated from an inside in response to the refresh mode signal S10 and provides the selected address to the insertion row address generation circuit 220.

The insertion row address generation circuit 220 includes insertion circuits 220a, 220b and 220c, the number of which corresponds to the number N of mom row addresses. In an example embodiment, three mom row addresses are proposed.

The insertion circuits 220a, 220b and 220c includes comparators CM1, CM2 and CM3, fuse enable signal generation circuit FE1, FE2 and FE3 and storage circuits FM1, FM2 and FM3, respectively.

The comparators CM1, CM2 and CM3 compare a row address signal S22 selected by the multiplexer MUX2 with the mom row addresses Mom1, Mom2 and Mom3 stored in the storage circuits FM1, FM2 and FM3, respectively and generate coincidence detection signals S26a, S26b and S26c depicted in FIG. 4, respectively.

The fuse enable signal generation circuit FE1, FE2 and FE3 output fuse enable signals S28a, S28b and S28c of FIG. 4 including continuous two signals in response to coincidence detection signals S26a, S26b and S26c, respectively.

The storage circuits FM1, FM2 and FM3 may include fuse circuits to store repair row addresses of row redundancy of the related art. The fuse circuit may be programmed with the baby row address and the mom row address through, for example, the laser zapping. The programmed fuse circuit stores the baby row address and the mom row address. The fuse circuit outputs the baby row address (or mom row address) stored in the fuse circuit in response to a first pulse signal of the fuse enable signal S28a, S28b or S28c, respectively. The fuse circuit outputs the mom row address (or baby row address) stored in the fuse circuit in response to a second pulse signal of the fuse enable signal S28a, S28b or S28c, respectively. Thus, the baby row address and the mom row address are provided to the refresh row address output circuit 230 as the insertion row address S32.

The refresh row address output circuit 230 includes an OR gate GOR to OR the coincidence detection signals S26a, S26b and S26c and a multiplexer MUX3. The multiplexer MUX3 selects one from the counter output S20 and the insertion row address S32 in response to the output signal of the OR gate GOR to provide the refresh row address S34 to the other side input terminal of the multiplexer MUX1. For example, the multiplexer MUX3 selects and outputs the insertion row address S32 at the high level of the coincidence detection signals S26a, S26b and S26c and selects and outputs the counter output S20 at the low level of the coincidence detection signals S26a, S26b and S26c.

The stop control signal generation circuit 240 generates the stop control signal S30 of FIG. 4 synchronized with the first pulse signal of the fuse enable signal S28a, S28b and S28c to provide the stop control signal S30 to the refresh timer RTM. Therefore, the refresh timer RTM temporarily stops generating the refresh pulse signal during one refresh interval in response to the stop control signal S30. For example, the generation of the refresh pulse signal is temporarily stopped in response to a rising edge of the stop control signal S30 and the generation of the refresh pulse signal is restarted in a falling edge of the stop control signal S30. In one embodiment, the stop control signal S30 may be provided to an external controller in an external refresh operation mode in order to insert the baby row address and the mom row address.

Referring to FIGS. 4, 5 and 6 in step S202, the DRAM 100 enters the refresh mode voluntarily or according to an command from an outside so that the refresh mode signal S10 becomes a high level. In step S204, the refresh timer RTM is initiated and outputs the refresh pulse signal every 16 ms when the refresh mode signal S10 becomes the high level.

The refresh counter RCT counts at the falling edge of the refresh pulse signal S18 so that the counter output is increased from the binary number of '0000' by T. The counter output S20 is applied to a row decoder of the memory cell array 12 through the multiplexers MUX3 and MUX1 to refresh the cells combined with the corresponding row.

Further, the counter output S20 is supplied to the insertion circuits 220a, 220b and 220c. The mom row address of binary number '0110' is stored in the storage circuit FM1 of the insertion circuit 220a. The comparator CM1 compares the row address signal S22 with the binary number of '0110' to determine whether the selected row address is identical to the binary number of '0110' in step S208.

When coincidence is not detected in step S208, it is checked in step S210 whether it is a counter reset timing. Then, when the counter output arrives at the end of the first refresh interval, the refresh counter RCT is reset to '0000' in step S212. Then, it is checked in step S214 whether the refresh is ended and if not, step S206 is performed.

When the coincidence is detected in step S208, a coincidence detection signal S26a is generated in step S216.

In step S222, the coincidence detection signal S26a is applied to the fuse enable signal generation circuit FE1 so that the fuse enable signal generation circuit FE1 outputs the fuse enable signal S28a of FIG. 4 when the coincidence detection signal S26a is at the high level.

The generated fuse enable signal S28a is applied to the stop control signal generation circuit 240 to generate the stop control signal S30a of FIG. 4. The stop control signal S30a is applied to the refresh timer RTM so that the operation of the refresh timer RTM is temporarily stopped in step S224.

Further, in step S226, the storage circuit FM1 sequentially outputs the baby row address and the mom row address S32a during the first refresh period by the interval of 16 ms in response to the fuse enable signal S28a which is applied from the fuse enable signal generation circuit FE1 to the storage circuit FM1. Thus, since the pulse signal S18 is not input to the refresh counter RCT in response to the stop control signal S30a, the refresh counter RCT maintains the output state of the binary number of '0110'.

While the output of the OR gate GOR is at the low level, the multiplexer MUX3 outputs the counter outputs of '0000-0001-0010-0011-0100-0101' as shown in FIG. 6. When the coincidence detection signal S26a is at the high level, the baby row address and the mom row address S32a of '0010-0110' are provided to the other input terminal of the multiplexer MUX3. Therefore, as shown in FIG. 6, the refresh row address S34 of the multiplexer MUX3 is output in order of '0000-0001-0010-0011-0100-0101-0010-0110' or '0000-0001-0010-0011-0100-0101-0110-0010'.

If the stop control signal S30 transitions from the high level to the low level, the refresh timer RTM restarts to generate the refresh pulse signal S18 in step S228. Step S206 is performed when the refresh timer RTM restarts the timer operation in step S228.

The refresh counter RCT does not perform the count operation at the $7^{TH}$ timing and counts the $7^{TH}$ refresh pulse signal at the $8^{TH}$ timing. Thus, since the counter output is increased by '1' so that the binary number of '0110' is converted into the binary number of '0111', the coincidence detection signal S26a of the comparator CM1 is transited from the high level to the low level.

Therefore, the multiplexer MUX3 selects the counter output S20 instead of the insertion row address S32. As shown in FIG. 6, the multiplexer MUX3 outputs the refresh row address S34 in the order of '0000-0001-0010-0011-0100-0101-0010-0110-0111-1000-1001' or '0000-0001-0010-0011-0100-0101-0110-0010-0111-1000-1001'.

Then, the multiplexer MUX3 sequentially generates and outputs the refresh row addresses S34 of '0010-1010' and '0010-1110' with respect to mom row addresses of '1010' and '1110' through the insertion circuits 220b and 220c, respectively, operated identically to the insertion circuit 220a.

Thus, the row address of '0010' is generated four times (N+1) during an adjusted refresh interval (e.g., the reference refresh interval of 256 ms+N×t_REF, t_REF being a target refresh time period for each row of the memory cell array indicating an amount of time between refreshing of consecutive rows). As shown in FIG. 6, the cells combined with the selected word line by the row address of '0010' are refreshed by a refresh interval in the range of 64 ms to 80 ms. Therefore, even the cells having a retention time of 80 ms~128 ms may be relived without being regarded as defective cells, so that the cells can be normally operated.

For example, normal cells combined with other word lines except for the selected word line by the row address of '0010' are refreshed at the refresh interval of '256 ms+3 (a number of Mom addresses)×16 ms=304 ms'.

The above description has been made on the assumption that refresh interval is 256 ms and the number of rows is 16 for the purpose of convenience of explanation. If the number of rows is increased from 16 rows to 4,096 rows and 3 mom addresses are designated in order to relieve 1 row address having a weak cell having a retention time in the range of 64 ms to 128 ms, the operation is as follows.

If the target refresh interval of 256 ms is divided by 4,096 rows, the target refresh time period of 62.5 us is obtained.

Since the refresh interval of a row corresponding to the baby row address (hereinafter, the row is referred as a baby row) is {256 ms+(3×62.5 us)}/4=64.047 ms and the refresh interval of each row corresponding to row address except for the row corresponding to baby row address (hereinafter, the row is referred as a normal row and the row address is referred as a normal row address) is 256 ms+3×62.5 us=256.1875 ms, the refresh interval of baby row address is about 64 ms and the refresh interval of normal row addresses is about 256 ms.

If it is assumed that the number of rows having the number of weak cells having the retention time in the range of 64 ms to 128 ms is 200 rows from among 4,096 rows and it is assumed that 3 mom addresses are designated with respect to each weak cell, the number of additional row addresses may be 600.

Therefore, the adjusted refresh interval is 256 ms+(600× 62.5 us)=293.5 ms, which is lengthened about 14% longer than the target refresh interval of 256 ms. The refresh interval of the weak cell is 293.5 ms/4=73.4 ms, which is lengthened about 14% longer than 64 ms.

Figure 7:
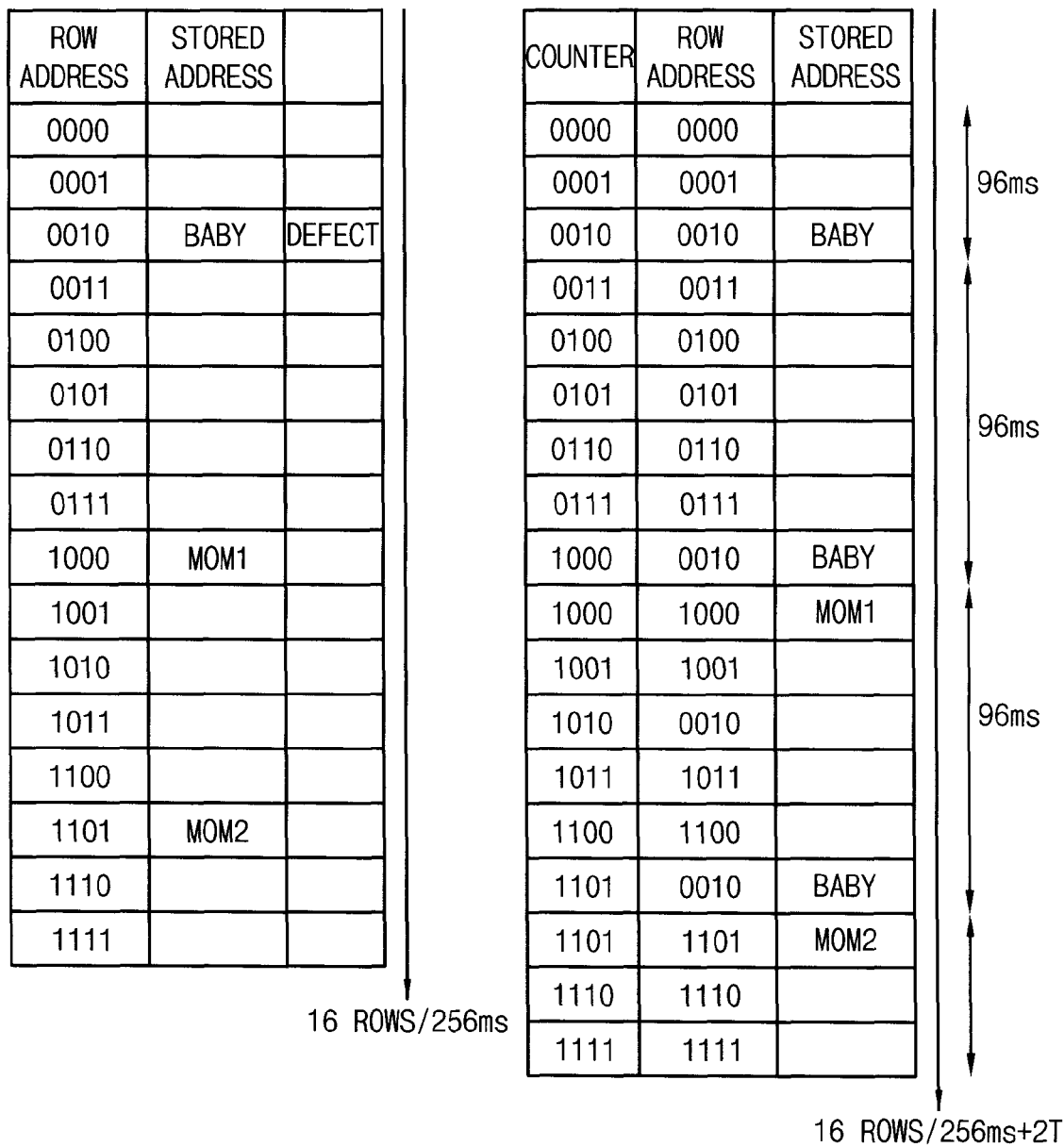
FIG. 7 is a diagram illustrating another example of designation of a mom row address and a refresh interval according to a retention time of a baby row address according to an example embodiment.

FIG. 7 is a diagram illustrating another example of designation of a mom row address and a refresh interval according to a retention time of a baby row address according to an example embodiment.

Compared with the example of FIG. 6 that the number of the mom row addresses is three, FIG. 7 illustrates an example that the number of the mom row addresses is two. For example, if it is assumed that the retention time guarantee of the defective row address of '0010' is in the range of 96 ms to 128 ms in the refresh interval of 256 ms, the row address of '0010' may be repeatedly refreshed three times during an adjusted refresh interval of 288 ms in the example of FIG. 7. In this case, since the mom row addresses of '1000' and '1101' are determined by a row address value which can determine a repeating refresh interval regardless of the code value of the baby row address of '0010', the fuse program of the mom row address may be easily designated.

Figure 8:
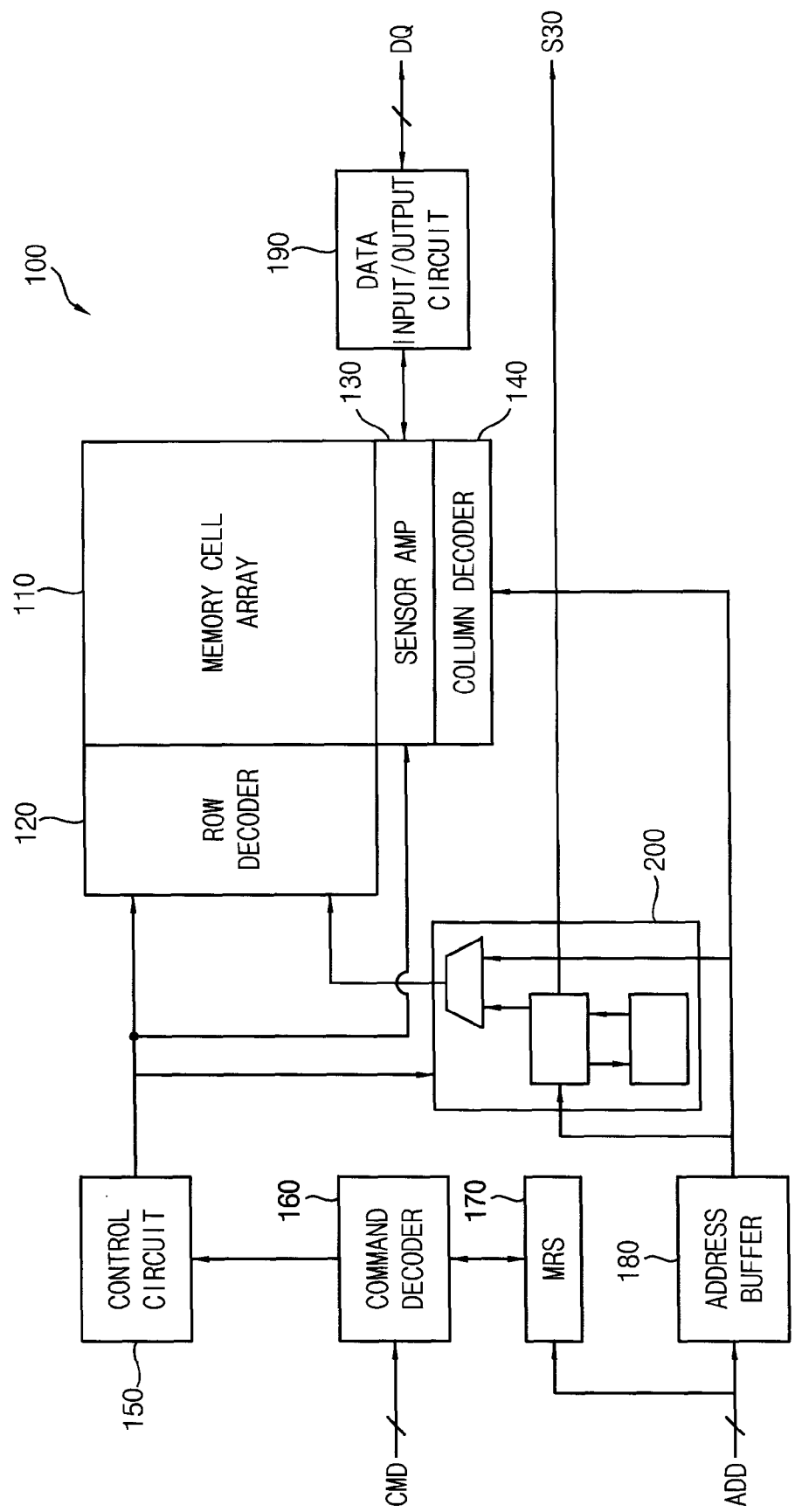
FIG. 8 is a block diagram illustrating a memory device according to certain embodiments.
Figure 9:
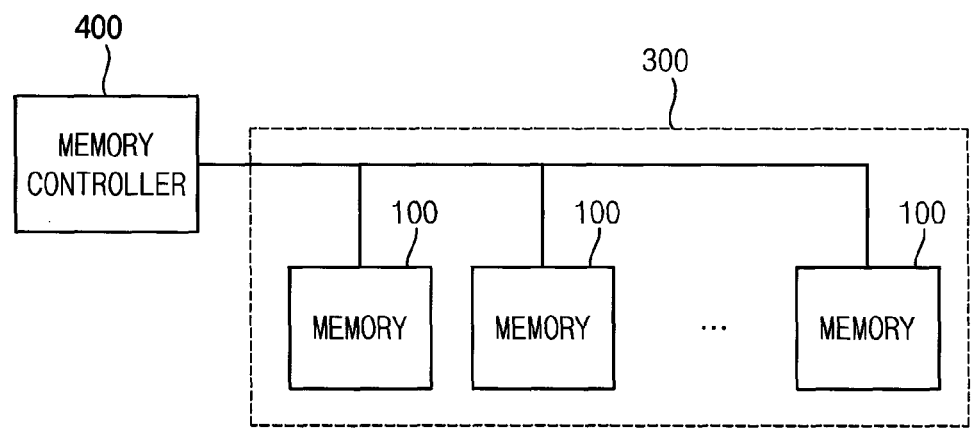
FIG. 9 is a block diagram illustrating a memory module including a memory device according to certain embodiments.
Figure 10:
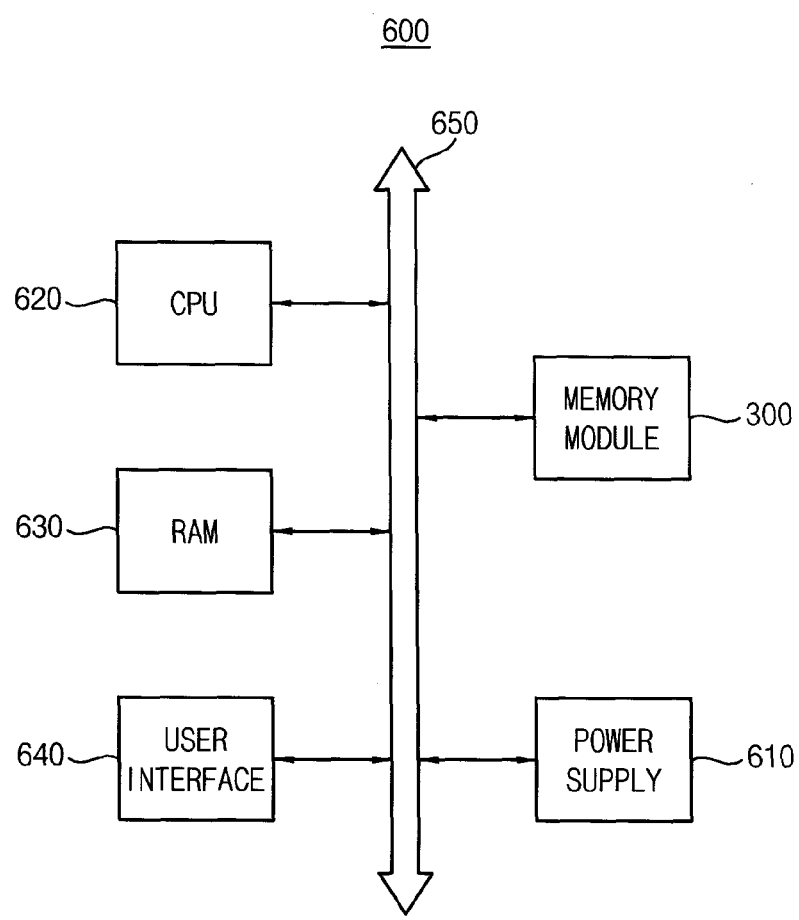
FIG. 10 is a block diagram illustrating a system in which a memory module is installed according to certain embodiments.

FIG. 8 is a block diagram illustrating a memory device according to certain embodiments, FIG. 9 is a block diagram illustrating a memory module including a memory device according to certain embodiments, and FIG. 10 is a block diagram illustrating a system in which a memory module is installed according to certain embodiments.

Referring to FIG. 8, the DRAM 100 may include a memory cell array 110, a row decoder 120, a sensor amplification circuit 130, a column decoder 140, a control circuit 150, a command decoder 160, a mode register set (MRS) 170, an address buffer 180, a data input/output circuit 190 and a refresh circuit 200. A schematic operation of the memory device 100 is as follows.

The memory cell array 110 is a data storage place in which many memory cells are arranged in a row direction and a column direction. The sensor amplification circuit 130 senses and amplifies a voltage difference between a pair of bit lines which is caused by the distribution of charges stored in the selected memory cell.

The data DQ input through the data input/output circuit 190 are written on the memory cell array 110 based on an address signal ADD. The data DQ read out from the memory cell array 110 are output through the data input/output circuit 190. In order to address the memory cell which data are written on or read out from, the address signal ADD is input to the address buffer 180. The address buffer 180 temporally stores the address signal ADD input from an outside.

In order to address a word line connected to the memory cell which data are input to or output from, the row decoder 120 decodes a row address of the address signal ADD output from the address buffer 180. For example, the row decoder 120 decodes the row address output from the address buffer 180 in the data writing or reading mode to enable the corresponding word line of the memory cell array 110.

In order to select a bit line connected to the memory cell which data are input to or output from, the column decoder 140 decodes a column address of the address signal ADD output from the address buffer 180.

The command decoder 160 receives an command signal CMD such as /CBR signal or /CKE signal applied from an outside and decodes the signal to generate the decoded command signal from the inside. The MRS circuit 170 sets an inner mode register in response to an MRS command for designating an operation mode of the DRAM 100 and the address signal ADD. The control circuit 150 may control the DRAM 100 in response to the command output from the command decoder 160.

Since the refresh circuit 200 is the same as those of the example embodiments describe above, the detailed description will be omitted.

Although not depicted in FIG. 8, the DRAM 100 may further include a clock circuit to generate a clock signal and a power circuit to receive a power source voltage applied from an outside to generate and divide an inner voltage.

Referring to FIG. 9, the memory module 300 may include a plurality of DRAMs 100 according to at least one example embodiment. The DRAM 100 may be controlled by the memory controller 400. Since the configuration and operation of the DRAM 100 are the same as or similar to those of the DRAM 100 described above, the detailed description will be omitted.

The DRAM 100 and/or the memory controller 400 according to an example embodiment may be mounted by using various types of packages. For example, the memory device and/or the memory controller according to an example embodiment may be mounted by using a package such as PoP (Package-on-Package), BGAs (Ball grid arrays), CSPs (Chip Scale Packages), PLCC (Plastic Leaded Chip Carrier), PDIP (Plastic Dual In-Line Package), Die in Waffle pack, Die in Wafer Form, COB (Chip On-Board), CERDIP (Ceramic Dual In-Line Package), MQFP (Plastic Metric Quad Flat Pack), TQFP (Thin QuadFlatpack), SOIC (Small Outline), SSOP (Shrink Small Outline Package), TSOP (Thin Small Outline), TQFP (Thin Quad Flatpack), SIP (System In Package), MCP (Multi Chip Package), WFP (Wafer-level Fabricated Package), or WSP (Wafer-Level Processed Stack Package).

Meanwhile, a DRAM or a memory module according to an example embodiment may be installed in a computing system (for example, a system such as a mobile apparatus or a desk top computer). One example of the system is shown in FIG. 10.

Referring to FIG. 10, a memory module 300 according to an example embodiment, a central process unit (CPU) 620, an RAM 630 and a user interface 640 are electrically connected to each other through a system bus 650 of the system 600. The CPU 620 controls the entire operation of the system 600. The RAM 630 stores information necessary for the operation of the system 600. The user interface 640 provides an interface for a user. Memories of the memory module 300 store N-bit data provided through the user interface 640 or processed/to be processed by the CPU 620, wherein N is an integer equal to or greater than '1'.

In the example embodiment of FIG. 10, the CPU 620 may include the function of the memory controller 400 of FIG. 9. In another example embodiment, a memory controller 400 separated from the CPU 620 may be further included. It is obvious to those in the art that an application chipset and a camera image processor (CIS) may be further provided to the system.

As described above, in the DRAM according to example embodiments, the refresh interval of the weak cells having a short retention time may be variously programmed by storing the mom row address through the program of the fuse circuit, so that productivity and yield rate may be improved.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of controlling a refresh operation for a memory device, the method comprising:
   storing a first row address corresponding to a first row of a memory cell array;
   storing one or more second row addresses corresponding to one or more second rows of the memory cell array, the one or more second row addresses corresponding to the first row address;
   sequentially generating row addresses as a refresh row address during a first refresh interval;
   for each generated row address, when a generated row address identical to one of the one or more second row addresses is detected, temporarily stopping the generation of row addresses and sequentially outputting the one second row address and the first row address as the refresh row address; and
   restarting the generation of row addresses as the refresh row address after outputting the one second row address and the first row address, wherein the first row address designates a first row including a weak cell having a data retention time shorter than the first refresh interval, and the one or more second row addresses designate the one or more second rows including memory cells such that all memory cells in the one or more second rows have data retention times at least as long as the first refresh interval, and wherein memory cells connected to the first row are refreshed more frequently by (N+1) times than other memory cells connected to other rows of the memory cell array, wherein N is a number of the one or more second row addresses.

2. The method of claim 1, wherein the first refresh interval is determined as $$T\_adjusted = T\_target + N \times t\_REF,$$

where T_target is a refresh interval for all rows of the memory cell array if none included weak cells, and t_REF is a target refresh time period for each row of the memory cell array.

3. The method of claim 1, wherein storing the first row address and the one or more second row addresses includes fuse programming the first row address and the one or more second row addresses.

4. The method of claim 1, wherein outputting the one second row address and the first row address includes:
outputting the first row address; and
outputting the one second row address after outputting the first row address.

5. The method of claim 1, wherein outputting the one second row address and the first row address includes:
outputting the one second row address; and
outputting the first row address after outputting the one second row address.

6. The method of claim 1, wherein at least one least significant bit of each second row address is identical to at least one least significant bit of the first row address.

7. A memory device comprising:
a memory cell array including a plurality of memory cells;
a refresh row address generation circuit configured to sequentially generate row addresses of the memory cell array as a refresh row address during a first refresh interval; and
a refresh row address insertion circuit configured to:
store a first row address and one or more second row addresses corresponding to the first row address of the memory cell array;
detect whether the generated row address is identical to one second row address of the stored second row addresses; and
for each generated row address, when a generated row address identical to the one second row address is detected, temporarily stop the generation of row addresses and sequentially output the one second row address and the first row address as the refresh row address,
wherein the refresh row address generation circuit is configured to restart the generation of row addresses as the refresh row address after outputting the one second row address and the first row address,
wherein the first row address designates a first row including a weak cell having a data retention time shorter than the first refresh interval, and the one or more second row addresses designate one or more second rows including memory cells such that all memory cells in the one or more second rows have data retention times at least as long as the first refresh interval, and wherein memory cells connected to the first row are refreshed more frequently by (N+1) times than other memory cells connected to other rows of the memory cell array, wherein N is a number of the one or more second row addresses.

8. The memory device of claim 7, wherein the refresh row address generation circuit comprises:
a refresh timer configured to generate a refresh pulse signal having a target refresh period in response to a stop control signal from the refresh row address insertion circuit; and
a refresh counter configured to generate the row addresses as the refresh row address by counting pulses in the refresh pulse signal.

9. The memory device of claim 7, wherein the refresh row address insertion circuit comprises:
one or more insertion row address generation circuits configured to, when the generated row address identical to the one second row address is detected, sequentially output the first row address and the one second row address as an insertion row address;
a stop control signal generation circuit configured to generate the stop control signal in response to the detection of the generated row address identical to the one second row address; and
a refresh row address output circuit configured to output the refresh row address including one of the insertion row address from the one or more insertion row address generated circuits and the generated row address from the refresh counter in response to the detection of the generated row address identical to the one second row address.

10. The memory device of claim 9, wherein each of the insertion row address generation circuits comprises:
a storage circuit configured to store the first row address and the one second row address;
a comparator configured to compare the one second row address with the generated row address; and
a fuse enable circuit to control outputs of the storage circuit in response to a result of the comparator.

11. The memory device of claim 10, wherein the storage circuit includes one or more fuses.

12. The memory device of claim 7, wherein at least one least significant bit of each second row address is identical to at least one least significant bit of the first row address.

13. The memory device of claim 7, wherein the first refresh interval is determined as $$T\_adjusted = T\_target + N \times t\_REF,$$

where T_target is a refresh interval for all rows of the memory cell array if none included weak cells, and t_REF is a target refresh time period for each row of the memory cell array.

14. A method of a refresh operation for a memory device including a memory cell array, the method comprising:
performing the refresh operation on the memory cell array in response to refresh row addresses during a first refresh interval;
storing a first row address corresponding to a first row of the memory cell array, the first row connected to one or more weak memory cells having a retention time shorter than a reference refresh interval shorter than the first refresh interval;

storing one or more second row addresses corresponding to one or more respective second rows of the memory cell array, the one or more respective second rows connected to memory cells having a retention time equal to or longer than the reference refresh interval;

sequentially generating row addresses as a refresh row address; and for each generated row address:
- when the generated row address is not the same as any of the one or more second row addresses, sequentially outputting the generated row address as the refresh row address; and
- when the generated row address is the same as one of the one or more second row addresses, stopping generation of row addresses and sequentially outputting the first row address and the one second row address as the refresh row address, wherein the one or more second row addresses include n row addresses, n being a natural number equal to or greater than 1, and wherein during the first refresh interval, a refresh operation on memory cells connected to the first row is preformed n+1 times, and a refresh operation on memory cells connected to second rows corresponding to each of the n row addresses is preformed one time.

15. The method of claim 14, wherein each of the one or more second row addresses is the same as the first row address except for at least two most significant bits.

16. The method of claim 14, wherein:
- the outputting the generated row address as the refresh row address includes selecting the generated row address by a multiplexer, and
- the outputting the first row address and the one or more second row addresses includes selecting the first row address and the one or more second row addresses by the multiplexer.

17. The method of claim 14, wherein the sequentially generating row addresses as a refresh row address includes restarting the generation of row addresses after outputting the first row address and the one second row address as the refresh row address.

* * * * *